United States Patent
Li et al.

(10) Patent No.: US 7,515,478 B2
(45) Date of Patent: Apr. 7, 2009

(54) CMOS LOGIC COMPATIBLE NON-VOLATILE MEMORY CELL STRUCTURE, OPERATION, AND ARRAY CONFIGURATION

(75) Inventors: Daniel D. Li, Highland, CA (US); Steve X. Zhou, Boise, ID (US)

(73) Assignee: Nantronics Semiconductor, Inc., San Ramon, CA (US)

( * ) Notice: Subject to any disclaimer, the term of this patent is extended or adjusted under 35 U.S.C. 154(b) by 0 days.

(21) Appl. No.: 11/841,468

(22) Filed: Aug. 20, 2007

(65) Prior Publication Data

US 2009/0052245 A1    Feb. 26, 2009

(51) Int. Cl.
G11C 16/04    (2006.01)
(52) U.S. Cl. ............... 365/185.26; 365/185.02; 365/185.05; 365/185.14; 365/185.18; 365/185.28; 365/185.29
(58) Field of Classification Search ............ 365/185.02, 365/185.05, 185.14, 185.18, 185.26, 185.28, 365/185.29
See application file for complete search history.

(56) References Cited

U.S. PATENT DOCUMENTS

| | | | | |
|---|---|---|---|---|
| 4,862,019 A | * | 8/1989 | Ashmore, Jr. | ........ 365/185.23 |
| 5,687,118 A | * | 11/1997 | Chang | |
| 5,761,121 A | * | 6/1998 | Chang | |
| 5,852,576 A | * | 12/1998 | Le et al. | |
| 5,912,842 A | * | 6/1999 | Chang et al. | |
| 6,191,980 B1 | * | 2/2001 | Kelley et al. | |
| 6,222,764 B1 | * | 4/2001 | Kelley et al. | ........ 365/185.07 |
| 6,326,663 B1 | * | 12/2001 | Li et al. | ........ 257/318 |
| 6,414,872 B1 | * | 7/2002 | Bergemont et al. | |
| 6,711,064 B2 | * | 3/2004 | Hsu et al. | |
| 6,853,583 B2 | * | 2/2005 | Diorio et al. | |
| 6,950,342 B2 | * | 9/2005 | Lindhorst et al. | |
| 7,221,596 B2 | * | 5/2007 | Pesavento et al. | ...... 365/185.21 |
| 2005/0030826 A1 | * | 2/2005 | Diorio et al. | |
| 2005/0030827 A1 | * | 2/2005 | Gilliland et al. | |
| 2005/0145924 A1 | * | 7/2005 | Liu et al. | |
| 2005/0146932 A1 | * | 7/2005 | Lee et al. | |
| 2007/0019475 A1 | * | 1/2007 | Diorio et al. | .......... 365/185.18 |

* cited by examiner

*Primary Examiner*—Huan Hoang
*Assistant Examiner*—Jay Radke
(74) *Attorney, Agent, or Firm*—Perkins Coie LLP

(57) ABSTRACT

The present invention is to provide a logic based single-poly non-volatile memory cell which is compatible with the CMOS process, uses lower voltages for operating, and is more reliable in program, read, or erase operation. A non-volatile memory cell in accordance with the present invention comprises a program transistor with a program transistor source as a first program terminal; a select transistor with a select transistor gate as a select terminal and a select transistor drain as a second program terminal; and an erase transistor with an erase transistor source and an erase transistor drain connected as an erase terminal, wherein the erase transistor shares a floating gate with the program transistor and the drain program transistor is connected to the select transistor source. By employing the present invention, significant cost advantages in feature-rich semiconductor products, such as System-on-Chip (SoC) design, compared to conventional dual-poly floating gate embedded Flash memory are provided.

27 Claims, 7 Drawing Sheets

Logic NVM cell with NMOS for Erase transistor

Logic NVM cell with PMOS for Erase transistor

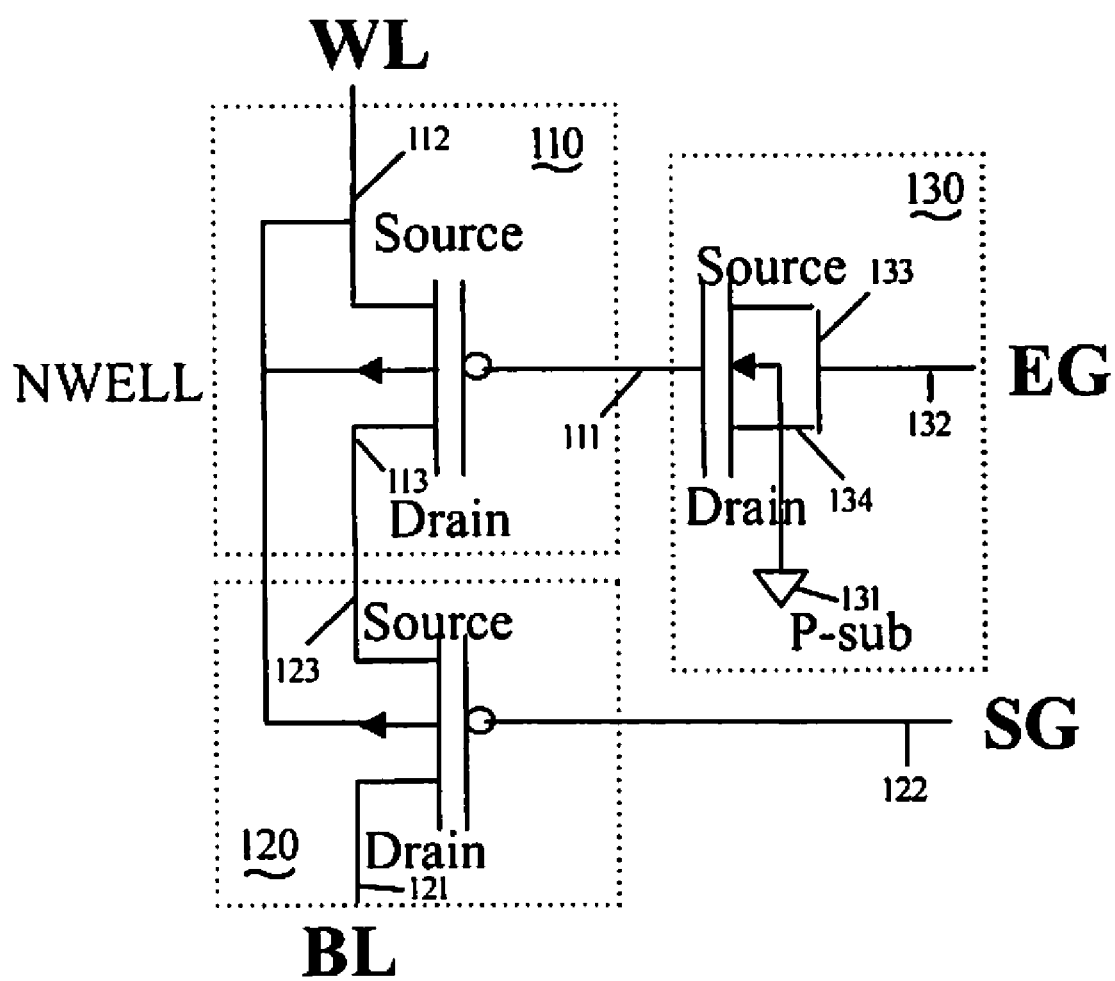
Fig 1a. Logic NVM cell with NMOS for Erase transistor

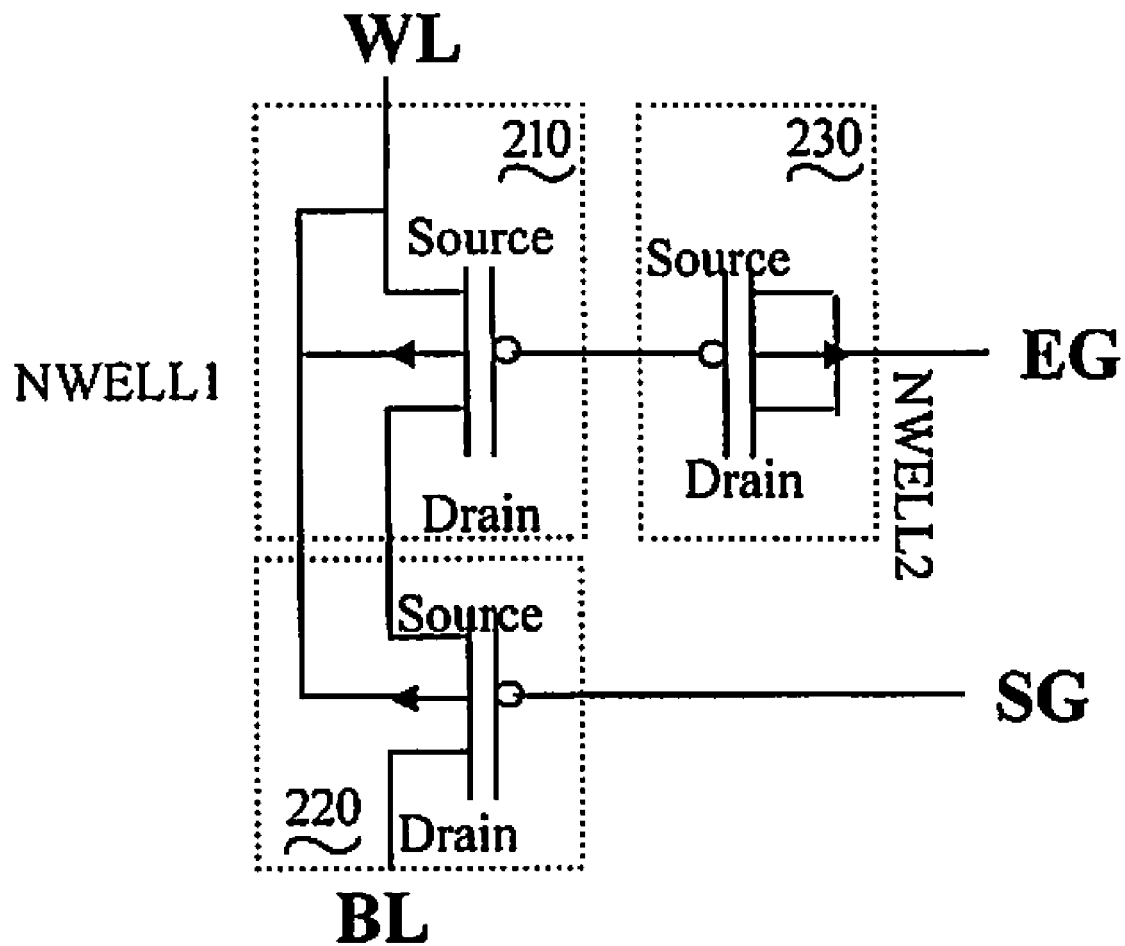
Fig 1b. Logic NVM cell with PMOS for Erase transistor

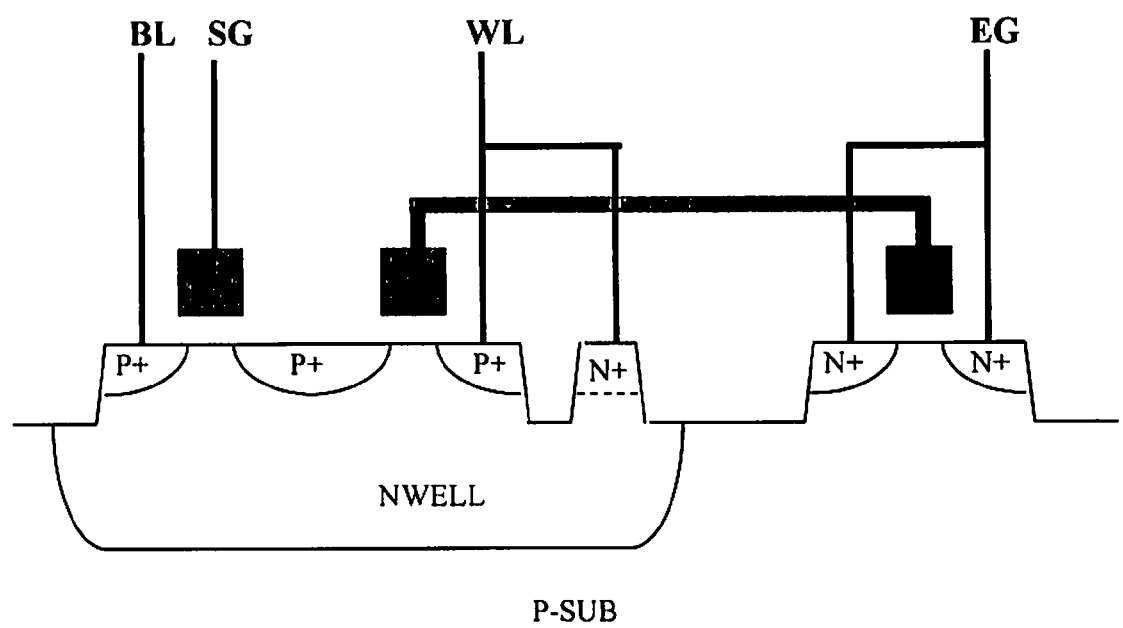
Fig 2a. Cross-sectional view of the cell structure shown in Fig 1a.

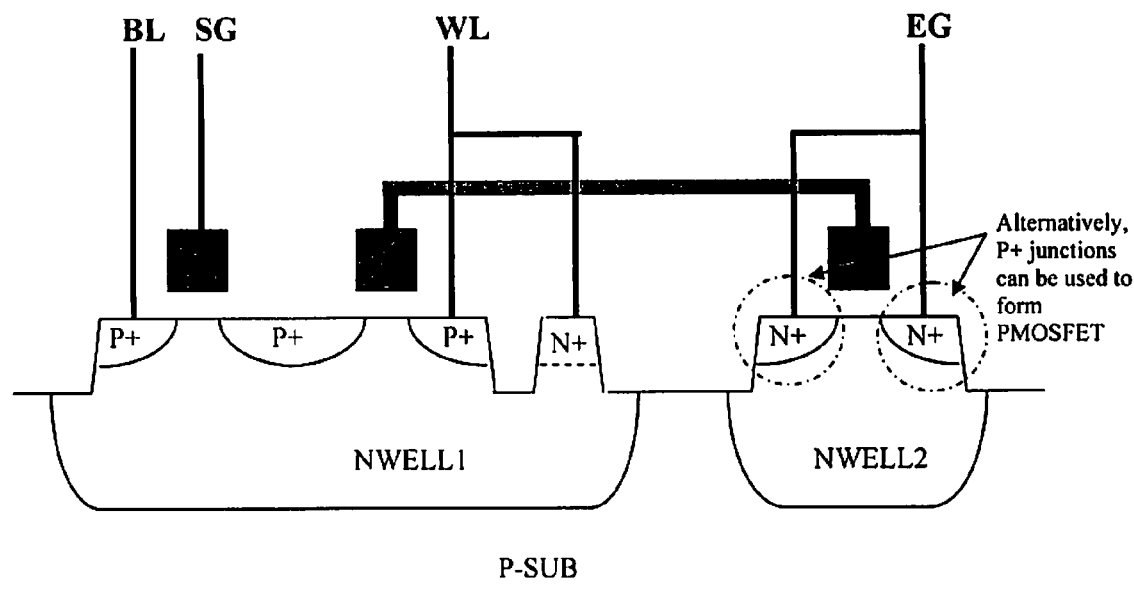
Fig 2b. Cross-sectional view of the cell structure shown in Fig 1b.

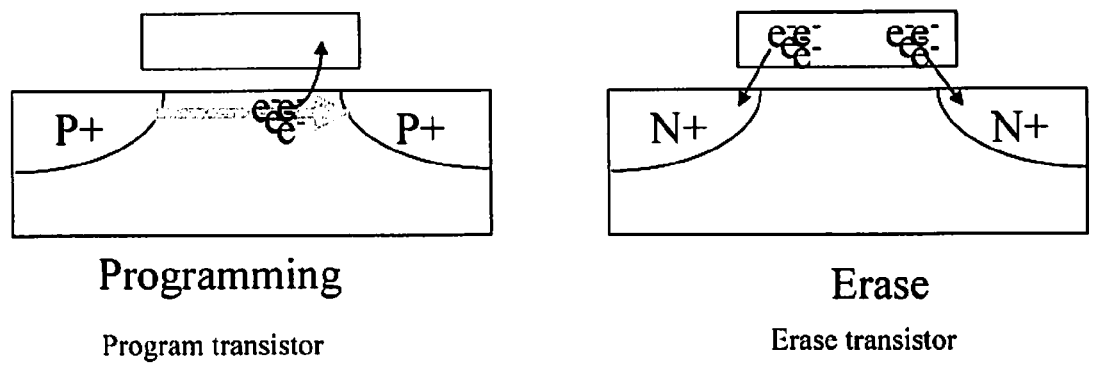
Fig 3. Program and erase mechanism illustrations for erase transistor being NMOSFET

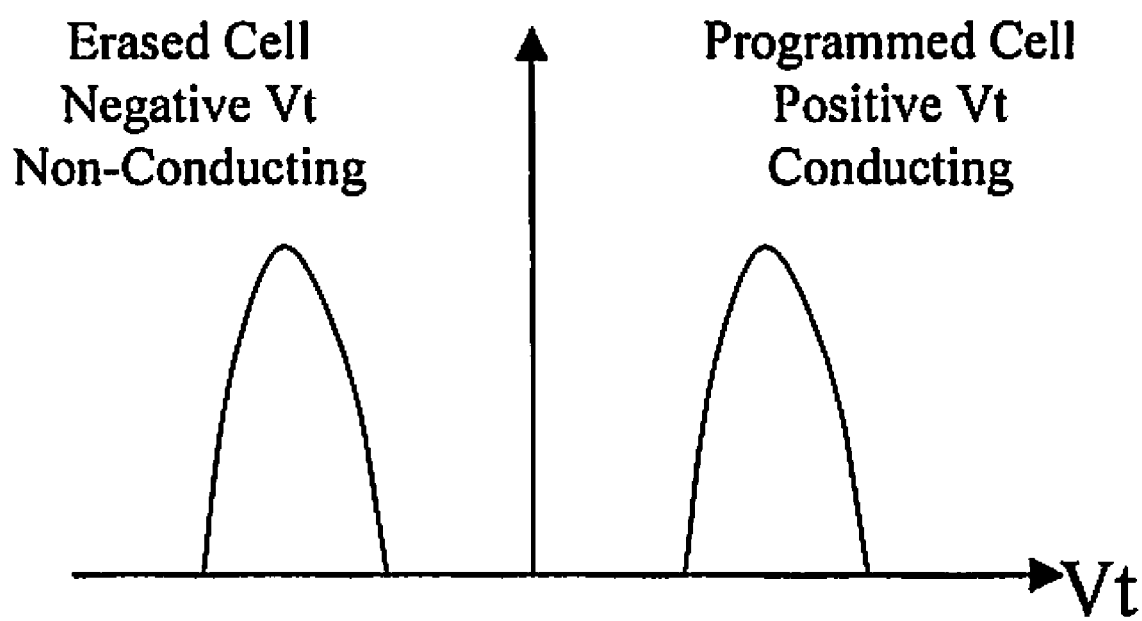
Fig 4. Cell Vt distribution

CMOS LOGIC COMPATIBLE NON-VOLATILE MEMORY CELL STRUCTURE, OPERATION, AND ARRAY CONFIGURATION

TECHNICAL FIELD

The present invention relates to non-volatile memory (NVM), and more particularly, to a CMOS Logic based non-volatile memory (NVM) which is made directly with CMOS logic process without any additional mask or process step.

BACKGROUND ARTS

NVM is now widely used for a variety of applications, since it may store information without continuously applied electric power, and by applying appropriate voltages, the NVM may be programmed or re-programmed (erased). Such a memory may provide a basic operating system or microcode for a logic device, such as a processor. A kind of NVM, embedded NVM in a CMOS device, allows a single chip produced by a manufacturer to be configured for various applications, and/or allows a single device to be configured by a user for different applications. Programming of the embedded NVM is typically done by downloading code from an external source, such as a computer.

However, many NVM processes require multiple layers of poly-silicon, while many conventional CMOS processes require only a single layer of poly-silicon. In order to embed this kind of NVM into a CMOS device, several additional processing steps are required. These additional processing steps result in increased processing time, higher cost of manufacturing, increased possibility of defects, and in turn result in lower yields. To address this problem, repair circuit regions on a die are included in some circuit designs in order to compensate for the reduced device yield. But valuable areas on the die are consumed by these repair circuits, further increasing the cost of manufacturing.

For example, a conventional 2-transistor EEPROM typically requires a high voltage (>15 Volts) in the bit line or word line diffusion to perform the erase and program operations. In addition, the conventional EEPROM cell structure creates manufacturing difficulties. As a result, the manufacturing cost of the conventional EEPROM is higher, the cell size is bigger, and the array density is limited to low density devices. Additionally, the complex topology of the conventional EEPROM cell also results in difficulties in alignment and scalability.

In another kind of EEPROM, stacked gate flash EEPROM, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a poly-silicon floating gate overlying the tunnel oxide and an inter-poly dielectric layer overlying the floating gate. Unfortunately, the thin tunnel (or floating gate) oxide may easily impact the wafer yield, and creates problems concerning reliability in manufacturing process.

Yet another kind of flash memory, split gate flash, is desirable to achieve efficient programming through carrier injection at a lower programming voltage (about 12V). The injection efficiency is achieved at desirably low programming currents by applying a relatively large potential to a first gate and a relatively small potential to a second gate. However, the design of typical split-gate device has an adverse impact on the cell density (the amount of information that may be stored in a defined area), as the first and second gates both consumes precious wafer area.

Other NVM cell structures are proposed. U.S. Pat. No. 5,892,709 discloses a single level gate nonvolatile memory device, which is simple and inexpensive to fabricate. Furthermore, the single level gate NVM is efficient and reliable to be accessed. However, the applied voltages for program and erase operations are definitely too high.

U.S. Pat. No. 6,631,087 discloses a single polysilicon EEPROM memory device that operates at relatively low erase and program voltages and currents. Furthermore, single polysilicon EEPROM does not suffer from various disturbances during the program, read and erase operations. For programming the memory cell, a bias voltage of 5V is applied, while a bias voltage of approximately −5V is applied for erasing operation. However, the bias voltage range of +5V to −5V is still too large, and as known to those skilled in the art, the applied negative voltage will bring negative impact on its application in many aspects.

To overcome these problems listed above, there is a need for a NVM which is compatible with the CMOS process, uses lower voltages for operating, and is more reliable in program, read, or erase operation.

SUMMARY OF THE INVENTION

The present invention teaches a variety of CMOS Logic based Non-Volatile-Memory (NVM) and the present disclosure describes herewith cell structure, operation, and array configuration of the proposed CMOS Logic based NVM. This NVM array is suitable for embedded non-volatile memory applications.

According to one aspect of the present invention, a non-volatile memory cell is provided, the memory cell includes a program transistor with a program transistor source as a first program terminal; a select transistor with a select transistor gate as a select terminal and a drain as a second program terminal; and an erase transistor with an erase transistor source and an erase transistor drain connected as an erase terminal, wherein the erase transistor shares a floating gate with the program transistor and the program transistor drain is connected to the select transistor source.

According to another aspect of the present invention, a non-volatile storage device is provided, the storage device including a plurality of cells, each cell comprising a program transistor with a program transistor source as a first program terminal; a select transistor with a select transistor gate as a select terminal and a program transistor drain as a second program terminal; and an erase transistor with an erase transistor source and an erase transistor drain connected as an erase terminal, wherein the erase transistor shares a floating gate with the program transistor and the program transistor drain is connected to the select transistor source. According to one embodiment of the present invention, the plurality of cells are arranged such that the second program terminals of the cells in a column are connected as a bit line, while the first program terminals of the cells in a row are connected as a word line, the select terminals thereof are connected as a select line, and the erase terminals thereof are connected as an erase line.

According to an embodiment of the invention, the non-volatile storage device may further include a program mechanism, wherein the program mechanism functions by applying a first voltage on the word line and grounding the select line and the bit line, wherein the first voltage is substantially not higher than 5V. The non-volatile storage device may further include a program inhibit mechanism, wherein the program inhibit mechanism functions by floating the bit line or grounding the word line.

According to another embodiment of the invention, the non-volatile storage device may further include a program mechanism, wherein the program mechanism functions by applying a first voltage on the word line, floating the select line, and grounding the bit line, wherein the first voltage is substantially not higher than 7V. The non-volatile storage device may further include a program inhibit mechanism, wherein the program inhibit mechanism functions by floating the erase line.

The non-volatile storage device may further include an erase mechanism, wherein the erase mechanism functions by applying a second voltage on the erase line, wherein the second voltage is substantially not higher than 7V.

The non-volatile storage device may further include a read mechanism, wherein the read mechanism functions by applying a third voltage on the select line and a fourth voltage on the bit line, said third voltage or the fourth voltage is significantly lower than the first voltage or the second voltage.

The non-volatile storage device may further include a high-voltage charge pump and a high-voltage switch.

In one embodiment of the present invention, the program mechanism functions by Channel Hot Electron (CHE) Injection, the erase mechanism functions by Fowler-Nordheim (FN) Tunneling. In another embodiment of the present invention, the program mechanism functions by Fowler-Nordheim (FN) Tunneling.

According to various aspects of the present invention, the program transistor and the select transistor may reside in a same WELL. For example, the program transistor and the select transistor may reside in a same NWELL, while the erase transistor resides in a separate NWELL.

According to various aspects of the present invention, the program transistor and the select transistor are PMOS transistors, and the erase transistor may be a NMOSFET residing in a P-substrate. Alternatively, the erase transistor may be a P doped PMOSFET. Alternatively, the erase transistor is an N doped PMOSFT.

To further lower the erase voltage, according to various aspects of the present invention, the erase transistor is much smaller than the program transistor.

BRIEF DESCRIPTION OF THE DRAWINGS

In order to understand the manner in which examples of the present invention are obtained, a more particular description of various examples of the invention briefly described above will be rendered by reference to the appended drawings. Understanding that these drawings depict only typical examples of the invention that are not necessarily drawn to scale and are not therefore to be considered to be limited of its scope, the examples of the invention will be described and explained with additional specificity and detail through the use of the accompanying drawings, in which:

FIGS. 1a and 1b show logic NVM cells in accordance with embodiments of the present invention;

FIG. 2a shows a cross-sectional view of the cell structure shown in FIG. 1a in accordance with an embodiment of the present invention;

FIG. 2b shows a cross-sectional view of the cell structure shown in FIG. 1b in accordance with an embodiment of the present invention;

FIG. 3 illustrates exemplary program and erase mechanisms of the logic NVM cell in accordance with an embodiment of the present invention;

FIG. 4 shows voltage distribution for program and erase states in accordance with an embodiment of the present invention.

DETAILED EMBODIMENTS

Figure 5:
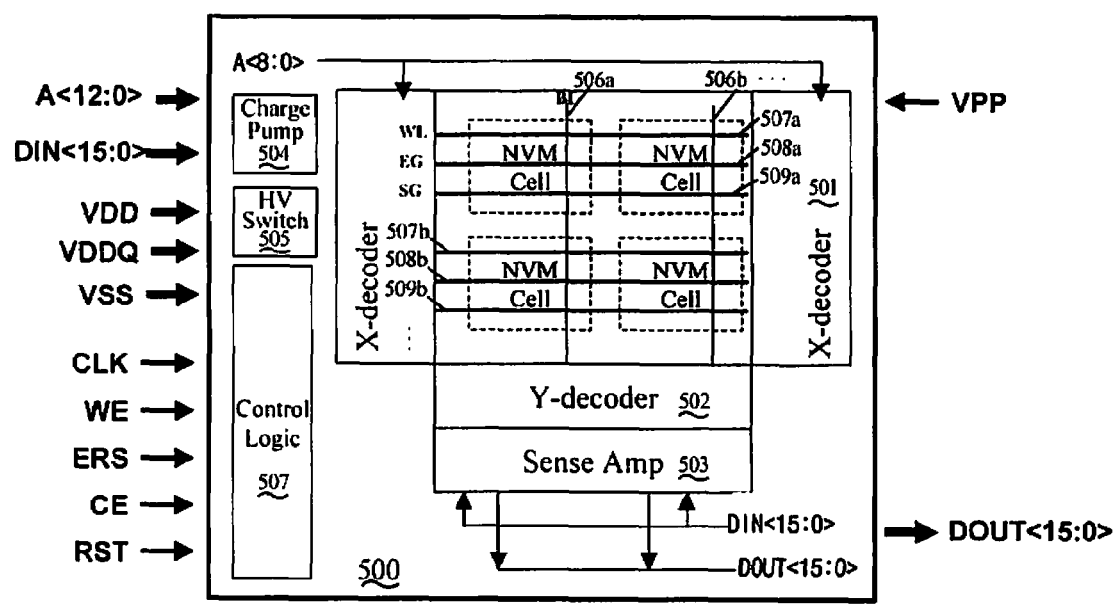
FIG. 5 shows an example of a chip floorplan to implement logic NVM cells into an embedded NVM memory block in accordance with an embodiment of the present invention.

Whereas many alterations and modifications of the present invention will become apparent to persons of ordinary skills in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

In this description and claims, the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are either in direct physical or electrical contact or that two or more elements are not in direct contact with each other but yet still co-operate or interact with each other.

Cell Structure

The core NVM cell structures comprising three transistors (transistors 110,120 and 130 in FIG. 1a, and transistors 210, 220 and 230 in FIG. 1b) are shown in FIG. 1a and FIG. 1b.

Referring to FIG. 1a, which shows a logic NVM cell 100 in accordance with an embodiment of the present invention, a transistor 110 (referred hereafter as "program transistor 110") is used for programming. A source 112 of the transistor 110 is connected to a NWELL (not shown) in which the source 112 resides and is used as a program terminal (may be referred as WL in a NVM array, which will be described below). A drain 113 of the transistor 110 is connected to a source terminal 123 of another transistor 120 (referred hereafter as "select transistor 120"). In an exemplary embodiment of the present invention, the select transistor 120 may reside in a same NWELL with the program transistor 110 to achieve a smaller footprint. However, the present invention is not limited in this aspect, and other configurations may be applied according to different applications. For example, the select transistor 120 and the program transistor 110 may reside in separate NWELLS. Alternatively, the program transistor 110 and the select transistor 120 may reside in a same PWELL with an erase transistor (described below). Drain 121 of the select transistor 120 serves as another program terminal (may be referred as BL in a NVM array, which will be described below). Gate 122 of the select transistor 120 serves as a select terminal, which may be referred as SG. Gate terminal 111 and is shared between the program transistor 110 and the erase transistor 130. This shared gate terminal 111 does not have any electrical connection to outside world, namely, the gate terminal 111 is floating. As that will be shown in later text, the charges are stored in this floating gate and will not be lost until intentionally erased. Hence, the non-volatility property is achieved. In an exemplary embodiment, the program transistor and the select transistor are PMOS transistors, but the present invention contemplates any suitable implementation.

The main difference between FIG. 1a and FIG. 1b lies in the configuration of the erase transistor. In FIG. 1a, an NMOSFET is used for the erase transistor 130 with a gate terminal of the erase transistor 130 connected to the gate terminal of the program transistor. The source 133 and drain 134 of the erase transistor 130 are directly connected together and connected to an erase terminal (EG) 132. A body terminal 131 of the erase transistor 130 may be simply P-substrate, which is normally held at ground level all the time by connecting to VSS pin. In FIG. 1b, a PMOSFET 230 is used for the erase transistor with a gate terminal of the erase transistor connected to the gate terminal of the program transistor 210. The source, drain and NWELL terminals of the erase transistor 230 are directly connected together and connected to the erase terminal. In PMOSFET, the source and drain of the PMOSFET are P+ junctions. Alternatively, the source and drain of the PMOSFET may be N+ doped. In this case, the PMOSFET transistor becomes a MOS capacitor.

The cross-sectional views of the cell structures are shown in FIG. 2a and FIG. 2b, which correspond to the schematics shown in FIG. 1a and FIG. 1b, respectively. Although the erase transistor is shown as N doped, as mentioned above, the erase transistor may also be P doped, and the three transistors may reside in a same PWELL.

To be completely compatible with CMOS process, the thickness of the gate oxide may be in the range of 60 to 80 Angstrom. Therefore, no additional mask or process steps are added in the manufacture of the NVM of the present invention. As will be appreciated by those skilled in the art, other thickness may also be possible, depending on different processes and application demands.

By means of an example, program transistor 110 and select transistor 120 have gate length and gate width of 0.35 um and 0.40 um, respectively; and the erase transistor 130 has gate length and gate width of 0.18 um and 0.20 um, respectively. However, the length and width of each transistor may be chosen to have the best performance and also allow lower voltage program/erase than conventional Flash technology. The rules for choosing transistor length and width are known to those skilled in the art, and will not be described herein. In one embodiment of the present invention, the erase transistor may be sized much smaller than the program transistor, for example, the ratio of gate area in erase transistor 130 to that in program transistor 110 being substantially 1:4. However, this ratio may be chosen to have the best program/erase performance and may be different from the example shown above. In doing so, the voltage applied for erase operation may be further reduced to be adapted for low voltage applications, which will be described below.

The program, the read and the erase operation of the NVM cell according to the present invention will be described below. In the following description, numerous details are set forth. It will be apparent, however, to those skilled in the art, that the present invention may be practiced without these specific details. Indeed, those skilled in the art having the benefit of this disclosure will appreciate that many other variations from the description and drawings may be made within the scope of the present inventions.

Cell Operations

Exemplary cell operation conditions are listed in Table 1, and specific cell operations are described by referring to these voltages for the purpose of illustration. Those skilled in the art will understand that these voltages are just for illustration, and the present invention is not so limited.

TABLE 1

Exemplary cell operation conditions

|  | EG | SG | WL | BL |
|---|---|---|---|---|
| Program (CHE) | 0 V | 0 V | 5 V | 0 V |
| Program Inhibit (same page/WL) | 0 V | 0 V | 5 V | floating |
| Erase (FN) | 7 V | 0 V | 0 V | 0 V |
| Read | Vcc | 0.5 V | Vcc | 0.7 V |

In one embodiment of the present invention, when programming the cell, a voltage of, for example, 5V is applied to the WL, which is the NWELL and source of the program transistor. The floating gate may be capacitively coupled to about 4V. Therefore, the gate to source potential difference of the program transistor is about −1V, which is slightly above threshold voltage of the program transistor. SG and BL terminals may both hold at ground. In this case, the select transistor is at an ON state; therefore 0V is transferred from BL to the drain junction of the program transistor. The large drain to source bias (−5V) creates high lateral electric field, which accelerates the hole current in the channel of program transistor. The highly energetic holes are accelerated near the drain junction to cause impact ionization to create electron-hole pairs. Since the gate to drain potential is high and favors electron injection. Some of these secondary electrons with enough energy may surpass the oxide potential barrier and get injected into the floating gate. The abovementioned program mechanism is called channel hot electron programming. However, the present invention is not limited in this aspect, and other methods may be used in this process.

Although the program process is described to be performed by the Channel hot electron (CHE) injection mechanism, the present invention is not limited in this aspect. Other suitable mechanisms may also be applied. For example, Band-to-Band-tunneling induced Hot Electron injection (BBHE), Source Side Injection (SSI) and Fowler-Nordheim tunneling (FN) may also be used for the program process in the present invention.

When arranged in a memory cell array (as it may be seen from FIG. 5), program inhibit mechanism may be needed for the cells on the same WL (or same page) as the cell under programming. Since these cells are on different BLs, program will not happen, or be inhibited, by floating the BL. For the cells on the same BL but not same WL, the program inhibit is done by holding WL at ground level. Although the program inhibit is described to be performed by floating the BL, the present invention is not limited in this aspect. For example, by applying 5V to Select transistor, select transistor is in an OFF condition, BL voltage will not be able to transfer to the drain junction of the program transistor. Therefore, programming will not occur.

The erasure of the cell may be achieved via Fowler-Nordheim tunneling through the gate oxide in the erase transistor. In one embodiment, a relatively large voltage (for example, 7V) is applied to the EG terminal, while keeping WL at ground. By making erase transistor much smaller than the program transistor, the floating gate potential is kept at close to ground due to the much larger capacitance in the program transistor. Hence, most of the potential drop is carried through the gate oxide of the erase transistor to cause Fowler-Nordheim tunneling. Electrons are then being removed from the floating gate. As mentioned above, although the erase process is described to be performed by the Fowler-Nordheim Tunneling mechanism, the present invention is not limited in this aspect. Other suitable mechanisms may also be applied. For example, Band-to-Band-tunneling induced Hot Hole injection (BBHH), Channel Hot Hole (CHH) injection may also be used for the erase process in the present invention.

Now referring to FIGS. 3 and 4 for detailed description of the program and erase operations. FIG. 3 illustrates exemplary program and erase mechanisms for the case of the erase transistor being an NMOSFET in accordance with an embodiment of the present invention. For the case of the erase transistor being a PMOSMET of MOS capacitor, the erase mechanism is very similar and therefore not shown herein.

FIG. 4 shows exemplary VT distribution for program and erase states in accordance with an embodiment of the present invention. A programmed cell has more positive Vt than a native state of the programmed cell and shows conduct current. An erased cell has more negative Vt than a native state of the erased cell and shows no current conduction.

In an embodiment of the present invention, when reading the cell, Vcc is applied to the WL, which is connected to the source and NWELL of the program transistor and the NWELL of the select transistor. Low voltages, for example, 0.5V and 0.7V may be applied to the SG and BL, respectively. In this case, the select transistor is at an ON state. If the cell is previously programmed, there are electrons on the floating gate. Vt of the program transistor is more positive than a native state of the programmed cell. The program transistor is then at an ON state and current will flow between WL node and BL node. On the other hand, if the cell is previously erased, Vt of the program transistor is more negative than a native state of the program transistor. The program transistor is then at an OFF state and current will not flow between WL node and BL node. By properly designing periphery sense amplifier circuits, the cell current difference between program state and erase state may be identified and converted to logic 1 and logic 0 states. Again, the present invention is not limited to the described reading scheme, and other technologies may also be applicable.

Alternative Embodiment

As mentioned above, other technologies may be used to perform the program, erase and read operations. As an example, with the same cell structure, F-N tunneling mechanism may also be used during programming. The exemplary operation conditions are shown in the following Table 2, and those skilled in the art will appreciate that these voltages are just for illustration other than limitation.

TABLE 2

Exemplary operation conditions for F-N tunneling mechanism

| | EG | SG | WL | BL |
|---|---|---|---|---|
| Program (FN) | 0 V | Floating | 7 V | 0 V |
| Program Inhibit (same page/WL) | Floating | Floating | 7 V | 0 V |
| Erase (FN) | 7 V | 0 V | 0 V | 0 V |
| Read | Vcc | 0.5 V | Vcc | 0.7 V |

When programming a selected cell, a voltage of, for example, 7V is applied to WL. By making erase transistor much smaller than the program transistor, floating gate potential is kept at close to 7V due to the much larger capacitance in program TRANSISTOR. Hence, most of the potential drop is carried through the gate oxide of the erase transistor to cause Fowler-Nordheim tunneling. Electrons are then being injected into the floating gate.

To prevent (inhibit) unwanted programming to the same cells on the same WL, the EG nodes of these cells are left isolated from periphery circuits. Since EG nodes are left floating, their potentials will rise together with WL voltage. Hence, the potential drop through the gate oxide of the erase transistor will be too small to cause F-N tunneling to take place.

The erase and read operations are the same as the cell using channel hot electron mechanism for programming, which are described above and will not be repeated here.

In the above descriptions, for purposes of explanation and not limitation, specific details are set forth in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well-known devices, circuits, and methods are omitted so as not to obscure the description of the present with unnecessary detail.

Array Organization and Chip Configuration

FIG. 5 shows an example of a chip floorplan to implement the NVM cells in accordance with the present invention into an embedded NVM memory block. As may be seen from FIG. 5, a plurality of cells are arranged such that the drain terminals of cells in columns are connected respectively as bit lines (BLs) 506a, 506b . . . , while the source terminals (and the NWELLs) of cells in rows are connected respectively as word lines (WLs) 507a, 507b . . . , the select terminals thereof are connected as select lines (SGs) 508a, 508b . . . , and the erase terminals thereof are connected as erase lines (EGs) 509a, 509b . . . . The array is configured in a cross-point way that the WL, EG, and SG nodes are decoded by x-decoder 501, and BL nodes are decoded by y-decoders 502 and connected to sense amplifiers 503 for data input/output. The memory block may also include a high-voltage charge pump 504 to generate the high voltages for program/erase operations. The memory block may further include high-voltage switches 505 and control logic circuits 507 for control the input interfaces. Other components are omitted in FIG. 5 for the purpose of clarity.

It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invent. In addition, it is to be understood that the location or arrangement of individual elements within each disclosed embodiment may be modified without departing from the spirit and scope of the invention.

Performance Comparison

The following Table 3 summarizes the major differences between Logic based NVM of the present invention and other double-poly NVM technologies, such as 2-transistor EEPROM and industry standard stacked gate flash EEPROM memory. Logic based NVM of the invention has distinguished advantages in terms of cost, scalability, program voltage, and ease of integration to SoC.

TABLE 3

Key performance comparison between Logic NVM and other NVM technologies

| | Logic NVM | Conventional 2T EEPROM | Stacked Gate Flash EEPROM | Split Gate SSI Flash |
|---|---|---|---|---|
| Process node | Most advanced | 2 nodes behind | 2 nodes behind | 2 nodes behind |
| Extra mask add-on | 0 | 6-10 | 6-10 | 4-6 |
| Scalability | Excellent | Difficult | Difficult | Moderately difficult |
| Integration to SoC | Easy | Difficult | Difficult | Difficult |
| Program voltage | Low (5-7 V) | High (15 V) | High (10-20 V) | Medium (12 V) |
| Read speed | Tens of nSec | Tens of nSec | Tens of nSec | Tens of nSec |
| Wafer yield impact | None | High | High | Moderately high |
| Density | Medium | Medium | High | Medium |
| Endurance | 1k to 10k cycles | 100k cycles | 10k cycles | 10k cycles |
| Retention | 10 years | 10 years | 10 years | 10 years |

While the above is a complete description of specific embodiments of the present invention, various modifications, variations, and alternatives may be employed. For example, the recited voltage levels could be varied to accommodate different design rules (circuit dimensions). These equivalents and alternatives are intended to be included within the scope of the present invention. Therefore, the scope of this invention should not be limited to the embodiments described, and should instead be defined by the appended claims.

What is claimed is:

1. A non-volatile memory cell comprising:
a program transistor with its source as a first program terminal;
a select transistor with its gate as a select terminal and a drain as a second program terminal; and
an erase transistor with its source and drain connected as an erase terminal,
wherein the erase transistor shares a floating gate with the program transistor and the drain of the program transistor is connected to the source of select transistor; and
wherein the cell is programmed by applying a first voltage on the first program terminal, floating the select terminal, and grounding the second program terminal.

2. The non-volatile memory cell as claimed in claim 1, wherein the program transistor and the select transistor reside in a same WELL.

3. The non-volatile memory cell as claimed in claim 1, wherein the program transistor and the select transistor reside in a same NWELL, while the erase transistor resides in a separate NWELL.

4. The non-volatile memory cell as claimed in claim 1, wherein the program transistor and the select transistor are PMOS transistors.

5. The non-volatile memory cell as claimed in claim 1, wherein the erase transistor is a NMOSFET residing in a P-substrate.

6. The non-volatile memory cell as claimed in claim 3, wherein the erase transistor is a P doped PMOSFET.

7. The non-volatile memory cell as claimed in claim 3, wherein a MOS capacitor comprising an N doped region is used in place of the erase transistor.

8. The non-volatile memory cell as claimed in claim 1, wherein the erase transistor is much smaller than the program transistor.

9. A non-volatile storage device, comprising:
a plurality of cells, each cell comprising:
a program transistor with its source as a first program terminal;
a select transistor with its gate as a select terminal and a drain as a second program terminal; and
an erase transistor with its source and drain connected as an erase terminal,
wherein the erase transistor shares a floating gate with the program transistor and the drain of the program transistor is connected to the source of select transistor,
wherein the plurality of cells are arranged such that the second program terminals of cells in a column are connected as a bit line, while the first program terminals of cells in a row are connected as a word line, the select terminals thereof are connected as a select line, and the erase terminals thereof are connected as an erase line, and
the device further comprising a program mechanism, wherein the program mechanism functions by applying a first voltage on the word line, floating the select line, and grounding the bit line.

10. The non-volatile storage device as claimed in claim 9, wherein the program transistor and the select transistor reside in a same WELL.

11. The non-volatile storage device as claimed in claim 9, wherein the program transistor and the select transistor reside in a same NWELL, while the erase transistor resides in a separate NWELL.

12. The non-volatile storage device as claimed in claim 9, wherein the program transistor and the select transistor are PMOS transistors.

13. The non-volatile storage device as claimed in claim 10, wherein the erase transistor is a NMOSFET and resides in a P-substrate.

14. The non-volatile storage device as claimed in claim 11, wherein the erase transistor is a P doped PMOSFET.

15. The non-volatile storage device as claimed in claim 11, wherein a MOS capacitor comprising an N doped region is used in place of the erase transistor.

16. The non-volatile storage device as claimed in claim 9, wherein the erase transistor is much smaller than the program transistor.

17. The non-volatile storage device as claimed in claim 9, further comprising a program mechanism, wherein the program mechanism functions by applying a first voltage on the word line and grounding the select line and the bit line, wherein the first voltage is substantially not higher than 5V.

18. The non-volatile storage device as claimed in claim 9, wherein the first voltage is substantially not higher than 7V.

19. The non-volatile storage device as claimed in claim 17, further comprising a program inhibit mechanism, wherein the program inhibit mechanism functions by floating the bit line or grounding the word line.

20. The non-volatile storage device as claimed in claim 18, further comprising a program inhibit mechanism, wherein the program inhibit mechanism functions by floating the erase line.

21. The non-volatile storage device as claimed in claim 9, further comprising an erase mechanism, wherein the erase mechanism functions by applying a second voltage on the erase line, wherein the second voltage is substantially not higher than 7V.

22. The non-volatile storage device as claimed in claim 9, further comprising a read mechanism, wherein the read mechanism functions by applying a third voltage on the select line and a fourth voltage on the bit line, said third voltage or the fourth voltage is significantly lower than the first voltage.

23. The non-volatile storage device as claimed in claim 17, wherein the program mechanism functions by Channel Hot Electron (CHE) Injection.

24. The non-volatile storage device as claimed in claim 18, wherein the program mechanism functions by Fowler-Nordheim (FN) Tunneling.

25. The non-volatile storage device as claimed in claim 21, wherein the erase mechanism functions by Fowler-Nordheim (FN) Tunneling.

26. The non-volatile storage device as claimed in claim 9, further comprising a high-voltage charge pump and a high-voltage switch.

27. The non-volatile storage device as claimed in claim 21, further comprising a read mechanism, wherein the read mechanism functions by applying a third voltage on the select line and a fourth voltage on the bit line, the third voltage or the fourth voltage being significantly lower than the second voltage.

* * * * *